United States Patent
Filson et al.

(10) Patent No.: US 9,263,842 B2
(45) Date of Patent: Feb. 16, 2016

(54) METHOD FOR ASSEMBLING AN ELECTRONIC DEVICE

(71) Applicant: Apple Inc., Cupertino, CA (US)

(72) Inventors: John Benjamin Filson, Mountain View, CA (US); Duane Lawrence Fowler, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 113 days.

(21) Appl. No.: 14/258,589

(22) Filed: Apr. 22, 2014

(65) Prior Publication Data

US 2014/0223731 A1  Aug. 14, 2014

Related U.S. Application Data

(63) Continuation of application No. 13/218,692, filed on Aug. 26, 2011, now Pat. No. 8,701,279, which is a continuation of application No. 12/204,497, filed on Sep. 4, 2008, now Pat. No. 8,023,260.

(60) Provisional application No. 60/967,505, filed on Sep. 4, 2007.

(51) Int. Cl.
*H05K 3/36* (2006.01)
*H01R 43/26* (2006.01)
(Continued)

(52) U.S. Cl.
CPC .............. *H01R 43/26* (2013.01); *G06F 1/1601* (2013.01); *G06F 1/1626* (2013.01); *G06F 1/1656* (2013.01); *H04M 1/0249* (2013.01); *H04M 1/0266* (2013.01); *H05K 5/0013* (2013.01); *H05K 5/0017* (2013.01); *H04M 1/0252* (2013.01); *Y10T 29/49002* (2015.01);
(Continued)

(58) Field of Classification Search
CPC ... G06F 1/1601; G06F 1/1656; G06F 1/1626; H04M 1/0249; H04M 1/0266; H04M 1/0252; H05K 5/0013; H05K 5/0017; H01R 43/26; H04B 1/3833; Y10T 29/49947; Y10T 29/49117; Y10T 29/49826; Y10T 29/49126; Y10T 29/49002; Y10T 29/4913
USPC .......... 29/830–832, 834; 174/354; 361/679.4, 361/753, 816; 455/347, 575.1
See application file for complete search history.

(56) References Cited

U.S. PATENT DOCUMENTS 4,621,373 A * 11/1986 Hodsdon .............. H04B 1/3833
361/679.4
5,596,487 A * 1/1997 Castaneda ............ H04B 1/3833
361/753

(Continued)

*Primary Examiner* — Donghai D Nguyen
(74) *Attorney, Agent, or Firm* — Brownstein Hyatt Farber Schreck, LLP

(57) ABSTRACT

An electronic device is provided. The device may include a plate placed behind a screen formed from a window and a display module to provide the screen with additional stiffness (e.g., to resist dropping events). The window may be maintained in the electronic device by trapping the window between a bezel and the display module. In some embodiments, the window may include a chamfered edge operative to be received by a recessed edge in the bezel. In some embodiments, the input mechanism of the electronic device may be metallic and need to be grounded, but may be surrounded by components or other non-grounding components. The device may include screws operative to pass through a circuit board to reach a frame, which may serve as a ground, where the screws are located in proximity of the button. In some embodiments, the circuit board may include an additional component for grounding the button.

12 Claims, 4 Drawing Sheets

(51) Int. Cl.
*G06F 1/16* (2006.01)
*H04M 1/02* (2006.01)
*H05K 5/00* (2006.01)

(52) U.S. Cl.
CPC ........ *Y10T29/4913* (2015.01); *Y10T 29/49117* (2015.01); *Y10T 29/49126* (2015.01); *Y10T 29/49826* (2015.01); *Y10T 29/49947* (2015.01)

(56) References Cited

U.S. PATENT DOCUMENTS

| | | | |
|---|---|---|---|
| 5,613,237 | A | 3/1997 | Bent et al. |
| 6,111,760 | A | 8/2000 | Nixon |
| 6,754,507 | B2 | 6/2004 | Takagi |
| 6,957,085 | B2 * | 10/2005 | Shin ............ G06F 1/1616 455/575.1 |
| 7,109,976 | B2 | 9/2006 | Cobain |
| 7,116,780 | B2 | 10/2006 | Sun |
| 7,269,439 | B2 | 9/2007 | Honda |
| 7,515,431 | B1 | 4/2009 | Zadesky et al. |
| 7,580,255 | B2 | 8/2009 | Crooijmans et al. |
| 2008/0154962 | A1 | 6/2008 | Yu et al. |
| 2009/0017263 | A1 | 1/2009 | Yeates |

* cited by examiner

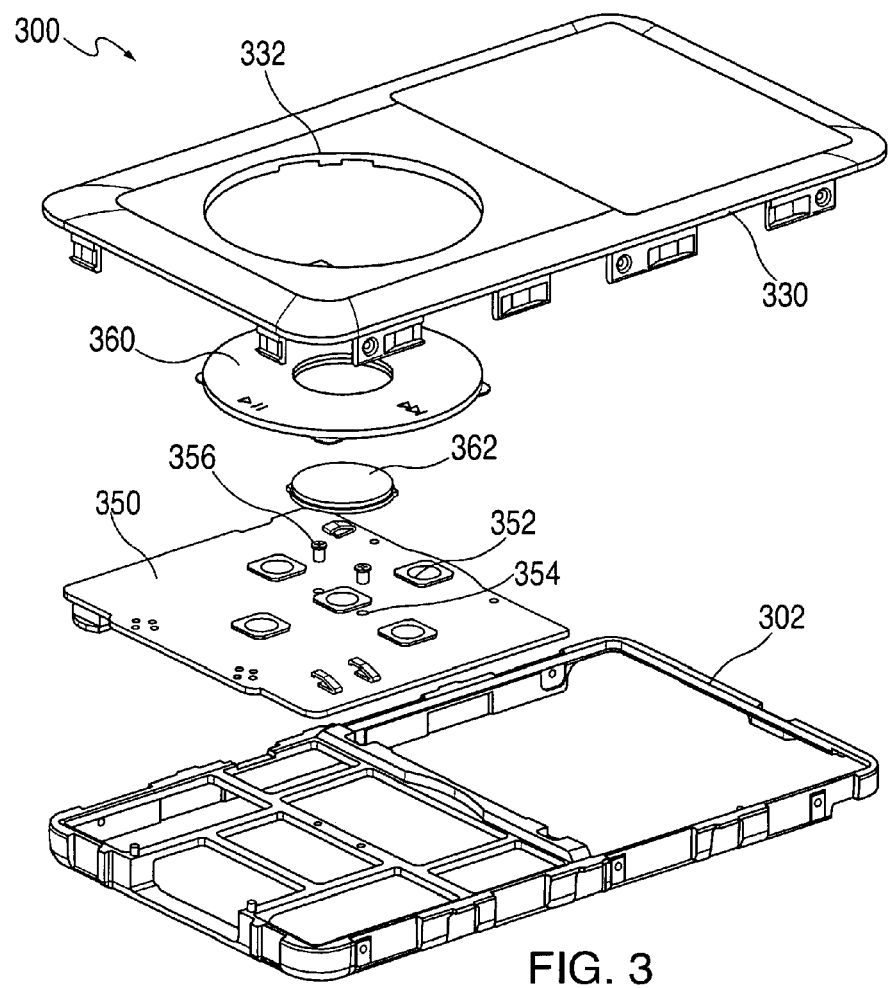
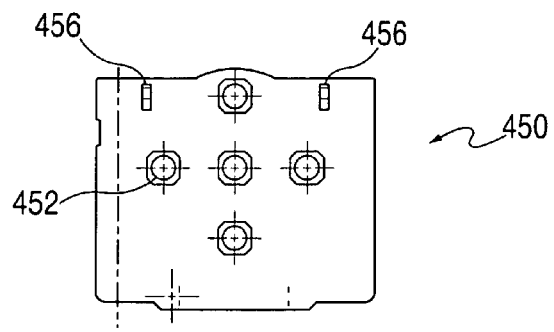
FIG. 3
FIG. 4

METHOD FOR ASSEMBLING AN ELECTRONIC DEVICE

CROSS-REFERENCE TO RELATED APPLICATIONS

This application is a continuation patent application of U.S. patent application Ser. No. 13/218,692, filed Aug. 26, 2011 and titled "Method for Assembling an Electronic Device," now U.S. Pat. No. 8,702,279, which is a continuation patent application of U.S. patent application Ser. No. 12/204,497, filed Sep. 4, 2008 and titled "Assembly of an Electronic Device," now U.S. Pat. No. 8,023,260, which claims the benefit of U.S. Provisional Patent Application No. 60/967,505, filed Sep. 4, 2007 and titled "Assembly of an Electronic Device," the disclosures of which are hereby incorporated by reference herein in their entireties.

BACKGROUND

This invention is directed to mechanical features of an electronic device.

SUMMARY

An electronic device is provided. The electronic device may include a frame, a bezel mounted to the frame, and a screen that includes a window and a display module mounted to the frame. In some embodiments, the screen may not be supported in its entirety by the frame. To ensure that the screen does not crack or propagate cracks, a plate may be coupled to the frame such that the screen (e.g., the display module) rests on the plate. The plate may be selected to increase the rigidity of the bezel.

In some embodiments, the electronic device may include an input mechanism. In some embodiments, button of the input mechanism may be metallic and need to be grounded. Because the input mechanism circuit board may be positioned between the button and the frame, the path for grounding the button may need to pass through the circuit board. In some embodiments, the button may be grounded using at least one exposed screw that passes through the circuit board, where the screw is operative to couple the circuit board to the frame. In some embodiments, the button may be grounded using a spring coupled to the circuit board and extending to reach at least one of the bezel and the frame. The spring may be electrically coupled to the button using a copper path.

BRIEF DESCRIPTION OF THE DRAWINGS

The above and other features of the present invention, its nature and various advantages will be more apparent upon consideration of the following detailed description, taken in conjunction with the accompanying drawings, and in which:

FIG. 3 is an exploded view of an electronic device that includes an input mechanism in accordance with one embodiment of the invention; and FIG. 4 is a top view of a circuit board in accordance with one embodiment of the invention.

DETAILED DESCRIPTION

Figure 1:
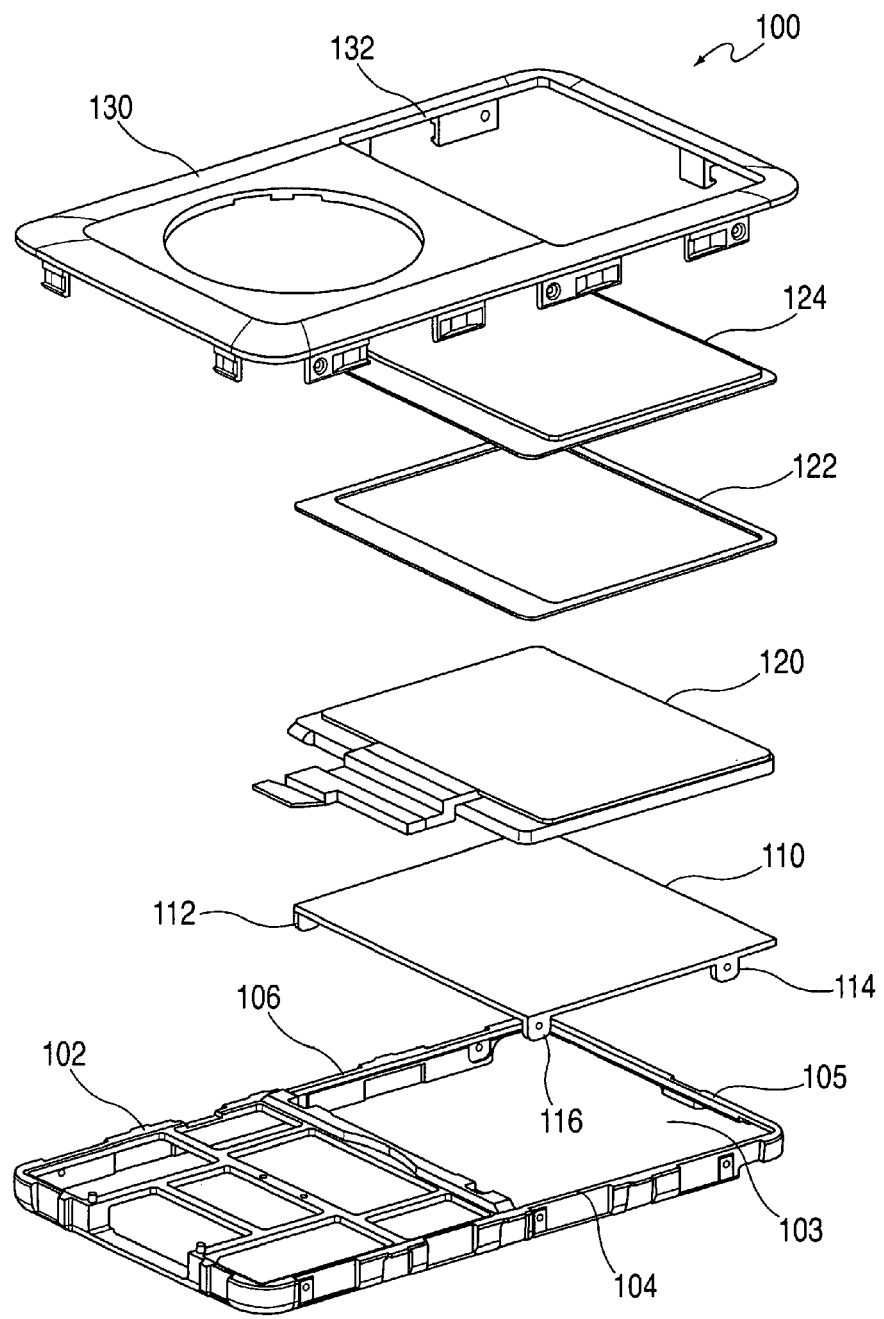
FIG. 1 is an exploded view of an electronic device in accordance with one embodiment of the invention.

FIG. 1 is an exploded view of an electronic device in accordance with one embodiment of the invention. Electronic device 100 may include any suitable type of electronic device, including for example a media player such as an iPod® available by Apple Inc., of Cupertino, Calif., a cellular telephone (e.g., an iPhone® available from Apple Inc.), a personal digital assistant, a desktop computer, a laptop computer, gaming console, set-top box, television system or television system component (e.g., a recording device), or any other suitable electronic device. Electronic device 100 may include a case formed from a bezel and a frame, a screen constructed from a window and a display module (e.g., as distinct elements or as a combined component) for displaying information to a user, and a user interface (e.g., a button) for providing inputs to the device. Frame 102 may provide the structure of electronic device 100, and may be operative to support some or all of the components of the electronic device (e.g., a circuit board, an input mechanism, a screen, a hard drive, or a battery). To form the outer surface of electronic device 100, a housing may be placed over the bottom of frame 102 (not shown), and bezel 130 may be placed over the top of frame 102. In some embodiments, frame 102 may instead include an aesthetically pleasing outer surface that may form part of the exterior of electronic device 100. The housing and bezel 130 may be coupled to frame 102 using any suitable approach, including for example an adhesive, tape, a mechanical fastener (e.g., a screw), a mechanical element (e.g., snap), or any other suitable approach.

Frame 102 may be manufactured using any suitable approach and from any suitable material. For example, frame 102 may be manufactured using one or more of forging, machining, forming, stamping, molding, casting, tumbling, polishing, or any other suitable process. Frame 102 may be manufactured any suitable material, including for example plastic, a composite material, metal, polymers, or any other suitable material. In some embodiments, frame 102 may be constructed from an electrically conductive material to serve as a ground for the electronic device.

Bezel 130 may be manufactured from any suitable material and using any suitable approach. For example, bezel 130 may be manufactured from plastic, a composite material, metal, polymers, or any other suitable material. In some embodiments, bezel 130 may be manufactured from a metal (e.g., aluminum or stainless steel) and polished to provide an aesthetically pleasing finish. In some embodiments, bezel 130 may be constructed using a Liquidmetal® alloy (available from Liquidmetal Technologies of Lake Forest, Calif.).

Electronic device 100 may include display module 120 for providing displays to a user. Display module 120 may include any suitable display module, including for example an LCD or plasma screen. To protect display module 120 from damage, electronic device 100 may include window 122 operative to be placed in aperture 132 of bezel 130 such that that window 122 extends through bezel 130. The outer surface of window 122 may be flush with outer surface 131 of bezel 131 to provide a uniform appearance, while bezel 130 may be placed against the bottom surface of window 122.

Window 122 may be coupled to the electronic device using any suitable approach. In some embodiments, window 122 may be inserted into bezel 130 from either the inside or outside of bezel 130, and coupled to the periphery of opening 103 using an adhesive, tape (e.g., double sided tape), mechanical fasteners, a gasket (e.g., gasket 124), or any other coupling mechanism. In some embodiments, window 122 may include a glass outer member and a plastic inner member that includes a flange for coupling display module 120 to the electronic device. A more detailed description of an approach for coupling a glass outer surface to a plastic inner surface may be found in commonly owned U.S. patent application Ser. No. 11/843,205, filed Aug. 22, 2007, incorporated herein in its entirety.

Display module 120 may be retained in electronic device 120 using any suitable approach. In some embodiments, frame 102 may include opening 103 substantially under display module 120 (e.g. for receiving an electronic device component, such as a battery) against which display module 120 may rest. Because the component may not have a uniform surface, or not be placed directly in contact with display module 120, the display module may be susceptible to bending during drop events or during bend and squeeze events. If the loads applied to window 122 or display module 120 exceed a maximum, cracks in display module 120 may propagate and distort the display of content on display module 120. To provide additional stiffness to display module 120, electronic device 100 may include support plate 110 between display module 120 and the other components of electronic device 100.

Support plate 110 may be coupled to frame 102 such that support plate 110 is placed under substantially all of display module 120. Plate 110 may be constructed from any material that has a suitable stiffness, including for example plastic, a composite material, a polymer, a metal, or any other suitable material. In some embodiments, plate 110 may be constructed from stainless steel (e.g., 301 series stainless steel). In some embodiments, display module 120 may be coupled to plate 110 (e.g., using an adhesive, tape, a mechanical fastener, or a mechanical element).

Plate 110 may be coupled to frame 102 using any suitable approach. In some embodiments, frame 102 may be constructed such that only three edges of plate 110 may rest on frame 102. For example, plate 110 may be operative to rest only on beams 104, 105 and 106 of frame 102, which may partially define the periphery of opening 103. To ensure that the remaining edge of plate 110 is sufficiently stiff to uniformly support display module 120, the remaining edge of plate 110 may include rib 112.

In some embodiments, plate 110 may be retained between display module 120 and frame 102 by positioning features of frame 102 into steps or other features of frame 102 (e.g., and retaining the plate using gravity). For example, plate 110 may include several tabs 114, each tab 114 having a hole 116 operative to align with holes in bezel 130 and frame 102 used to couple bezel 130 to frame 102. For example, plate 110 may include four tabs 114, each aligned with previously existing screw holes in bezel 130 and frame 102. By aligning tabs 114 where previously existing screws were inserted into frame 102, plate 110 may be coupled to frame 102 without significantly changing frame 102 or adding a new component to what may already be a small area.

Figure 2A:
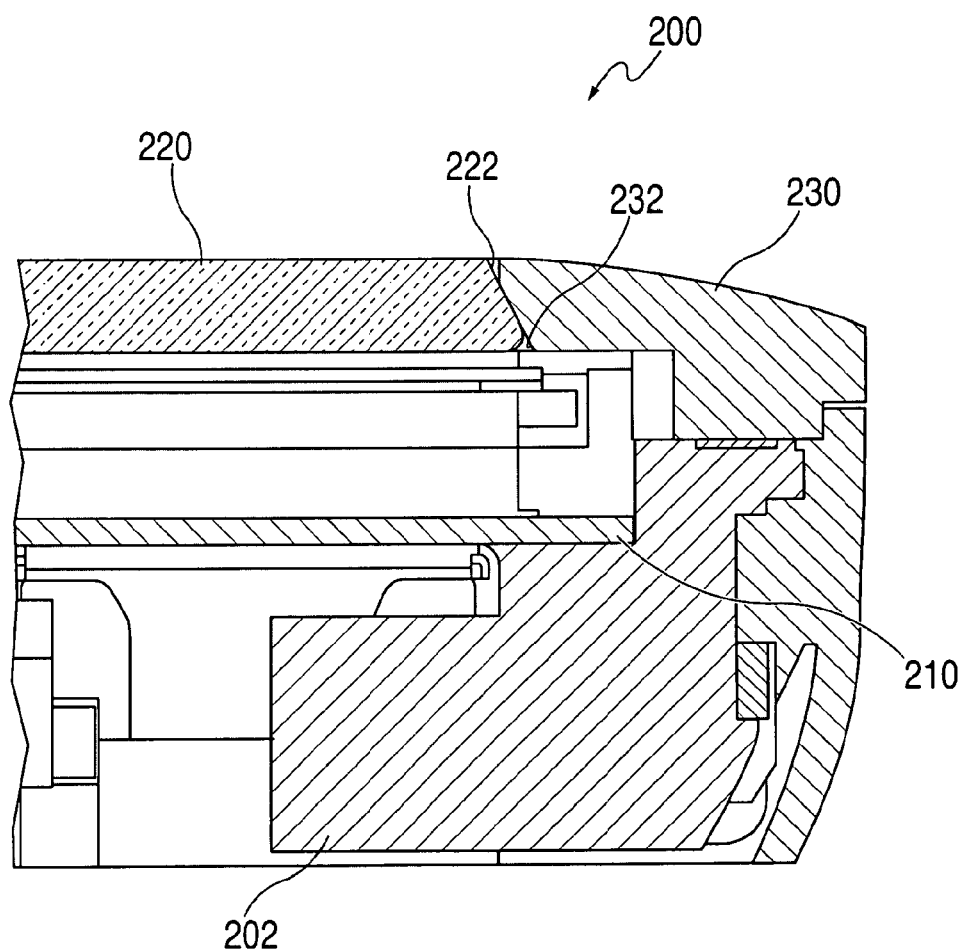
FIGS. 2A and 2B are cross-sectional views of an a electronic device in which a window has been mounted in accordance with one embodiment of the invention.
Figure 2B:
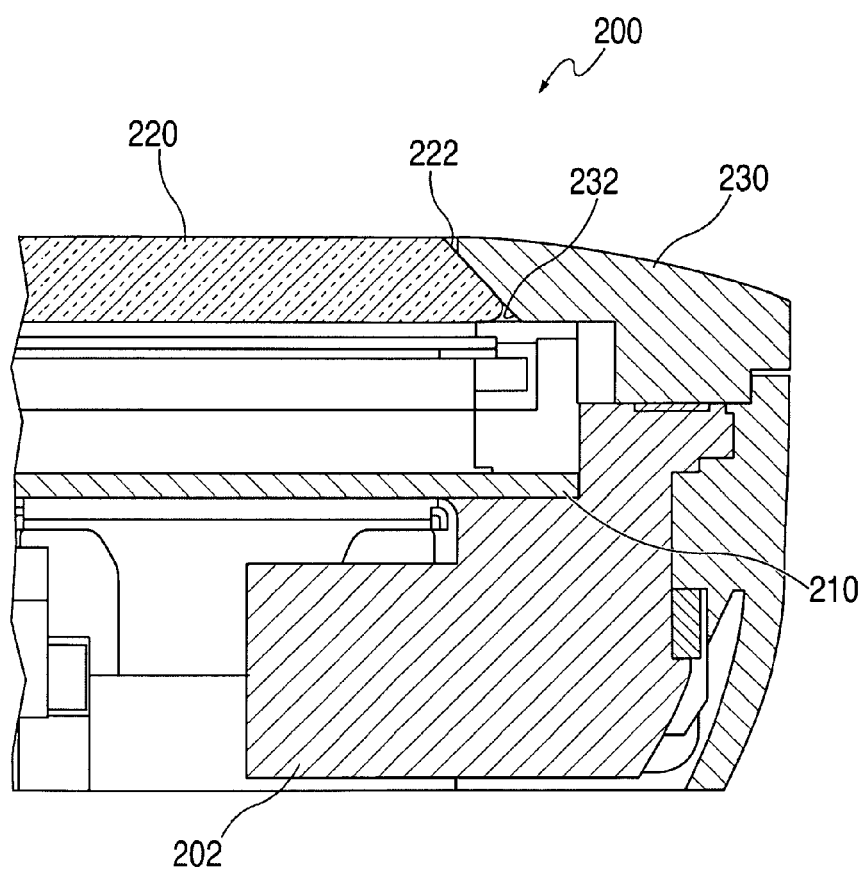

In some embodiments, the window may include a chamfered edge by which the window may be retained in the bezel. FIGS. 2A and 2B are cross-sectional views of an electronic device in which a window has been mounted in accordance with one embodiment of the invention. Electronic device 200 may include frame 202, plate 210, window 220 and bezel 230, which may include some or all of the features described above in connection with frame 102, plate 110, display module 120 and bezel 130 (FIG. 1). Window 220 may include chamfered edge 222, which may be chamfered at any suitable angle (e.g., 35 degrees in FIG. 2A, 45 degrees in FIG. 2B). Chamfered edge 222 may be operative to abut counterpart recessed edge 232 of bezel 230. In some embodiments, the angle of recessed edge 232 may be complimentary with the angle of chamfered edge 222 (e.g., 35 and 55 degrees in FIG. 2A, 45 and 45 degrees in FIG. 2B). Chamfered edge 222 may extend around any suitable portion of the periphery of window 220. For example, chamfered edge 222 may extend along some or all of particular sides of window 220 (e.g., only along opposing sides of window 220), around the entire periphery of window 220, or at discrete portions of the periphery of window 220.

To retain window 220 within bezel 230, recessed edge 232 may be chamfered inwardly from an outer surface to an inner surface of bezel 230, and chamfered edge 222 may be chamfered outwardly from an outer portion to an inner portion of window 220. Window 220 may thus be inserted into the back surface of bezel 230 and retained underneath bezel 230. Once window 220 has been properly positioned in opening 103 (FIG. 1), and each chamfered edge 222 of window 220 equally abuts recessed edges 232 of bezel 230, plate 210 may be coupled to bezel 230 (directly or via frame 202). Window 220 may then be trapped between bezel 230 and plate 210. In some embodiments, window 220 may in addition be coupled to bezel 230 or plate 210 (e.g., using an adhesive or tape). Other approaches for mounting a window to a device using a chamfer are described in commonly assigned U.S. patent application Ser. No. 12/172,073 filed Jul. 11, 2008, which is incorporated by reference herein in its entirety.

In some embodiments, the electronic device may include an input mechanism. For example, the input mechanism may include several buttons that extend through the surface of the bezel (e.g., a click-wheel). FIG. 3 is an exploded view of an electronic device that includes an input mechanism in accordance with one embodiment of the invention. Electronic device 300 may include frame 302 and bezel 330, which may include some or all of the features of frame 102 and bezel 130 (FIG. 1). Bezel 330 may include aperture 332 operative to receive wheel 360 and button 362, which may serve as the input mechanisms for the electronic device (e.g., the components of a click-wheel). Wheel 360 and button 362 may be electrically coupled to input mechanism circuit board 350. Circuit board 350 may include several switches 352 (e.g., five dome switches), wherein each switch 352 is operative to align with one of the buttons of wheel 360 and button 362. In response to an input on a button of wheel 360 or button 362, the status of the switch associated with the selected button may be changed to indicate the input to the circuit board.

In some embodiments, button 362 may be formed from a metal or other conductive material. In such embodiments, it may be necessary to ground button 362 (e.g., electrically connect button 362 to frame 302) to avoid electrostatic discharge (ESD) Because board 350 may be positioned between button 362 and frame 302 (e.g., the ground), the path for grounding button 362 may be required to pass through board 350. Electronic device 300 may include any suitable approach for creating a path to a ground through circuit board 350. In some embodiments, circuit board 350 may include exposed copper that may be placed in contact with frame 302 or bezel 330 to ground the circuit board. This approach, however, may not be sufficient to ground portions of wheel 360 and button 362 that are not in contact with circuit board 350.

In some embodiments, board 350 may be coupled to frame 302 using screws 356 or another mechanical fastener. For example, board 350 may include holes 354 which may be aligned with screw taps in frame 302. Board 350 may then be coupled to frame 302 by screws 356, which may pass through holes 354 and into frame 302. To use screws 356 as a path to the ground, screws 356 may remain exposed in board 350 once the board is coupled to frame 302 (e.g., solder resist may be removed from the vicinity of screws 356). Then, when a charge has built up in button 362 and needs to be released, the charge may jump from button 362 to screws 356 and move down to frame 302 (e.g., because screws 356 may be metallic and provide a conductive path to the ground). In some embodiments board 350 may include one or more resistors for further directing charges from button 362 to move to screws 356 and away from other components of circuit board 350.

In some embodiments, board 350 may instead or in addition include a specific component operative to ground button 362. FIG. 4 is a top view of a circuit board in accordance with one embodiment of the invention. Board 450 may include several switches 452 (e.g., dome switches) operative to align with the buttons of the wheel and button of the input mechanism (e.g., wheel 360 and button 362, FIG. 3). Instead of or in addition to screws (e.g., screws 356, FIG. 3) for coupling board 450 to the electronic device frame, board 450 may include another component for grounding the metallic button of the input mechanism (e.g., button 362). Board 450 may include one or more conductive springs 456 soldered to board 450 and operative to extend from board 450 and contact a ground surface (e.g., the bezel, which may be coupled to the frame, or the frame). A copper trace (not shown) may provide an electrical connection between exposed metal corners of switches 452 located underneath the center button (e.g., button 362) and springs 456. To ground the center button, charges may jump from the center button to the exposed metal corners of switches 452, follow the copper path to springs 456 (e.g., because springs 456 may be constructed from a conductive material), and pass to the frame (or the bezel). In some embodiments, board 450 may include one or more resistors on other paths accessible from the center button to act as a shield preventing charges accumulated in the button from jumping from the exposed metal corners of switches 452 into the traces of the board.

The above described embodiments of the invention are presented for purposes of illustration and not of limitation, and the present invention is limited only by the claims which follow.

What is claimed is:

1. A method for assembling an electronic device, the method comprising:
   physically coupling a frame to a group of walls of a structure, wherein the frame serves as a circuit ground;
   retaining an input mechanism positioned at least partially within one of the structure and the frame,
   placing a circuit board between the input mechanism and the frame;
   retaining a display positioned at least partially within one of the structure and the frame wherein a path passing through the circuit board to connect to the input mechanism to the frame is used to ground the input mechanism.

2. The method of claim 1, wherein the path comprises at least one screw passing through the circuit board.

3. The method of claim 1, further comprising electrically and physically coupling an elastic member to the circuit board and at least one of the frame and the structure.

4. The method of claim 3, wherein the elastic member is electrically coupled to the input mechanism.

5. The method of claim 3, further comprising electrically and physically coupling a plurality of elastic members to the circuit board and at least one of the frame and the structure.

6. The method of claim 1, wherein the structure further comprises:
   a housing positioned below and coupled to the frame; and
   a bezel positioned above and coupled to the frame, the bezel comprising:
      a first aperture formed through the planar surface for receiving an input mechanism; and
      a second aperture formed through the planar surface for receiving a window.

7. The method of claim 6 further comprising inserting the input mechanism into the first aperture of the bezel of the structure.

8. The method of claim 6 further comprising physically coupling a window to the bezel of the structure, the window positioned within the second aperture,
   wherein the outer surface of the window may be flush with the planar surface of the structure.

9. The method of claim 8 further comprising:
   positioning a display module adjacent the window positioned within the second aperture of the bezel of the structure; and
   physically coupling a support plate between the display module and the frame.

10. The method of claim 9 further comprising coupling the support plate to the frame.

11. The method of claim 9, wherein the support plate is formed from at least one of: a composite material, a polymer, and a metal.

12. The method of claim 9 further comprising physically coupling the display module to the support plate using at least one of an adhesive and a tape.

* * * * *